United States Patent [19]
Tracy et al.

[11] Patent Number: 4,970,176
[45] Date of Patent: Nov. 13, 1990

[54] MULTIPLE STEP METALLIZATION PROCESS

[75] Inventors: Clarence J. Tracy, Tempe; John L. Freeman, Jr., Mesa; Robert L. Duffin, Mesa; Anthony Polito, Mesa, all of Ariz.

[73] Assignee: Motorola, Inc., Schaumburg, Ill.

[21] Appl. No.: 414,355

[22] Filed: Sep. 29, 1989

[51] Int. Cl.⁵ ............................................. H01L 21/28
[52] U.S. Cl. ..................................... 437/187; 437/188; 437/197; 437/246; 437/247; 148/DIG. 25
[58] Field of Search ............... 437/187, 197, 194, 195, 437/199, 203, 246, 247, 196, 198, 188; 148/DIG. 25

[56] References Cited

U.S. PATENT DOCUMENTS

| | | | |
|---|---|---|---|
| 4,818,723 | 4/1989 | Yen | 437/246 |
| 4,874,719 | 10/1989 | Kurosawa | 437/246 |
| 4,897,709 | 1/1990 | Yokoyama et al. | 357/54 |

FOREIGN PATENT DOCUMENTS

| | | | |
|---|---|---|---|
| 0097848 | 1/1984 | Japan | 437/197 |
| 0119744 | 7/1984 | Japan | 437/246 |
| 0089648 | 5/1986 | Japan | 437/195 |
| 0136547 | 6/1988 | Japan | 437/194 |

Primary Examiner—Brian E. Hearn
Assistant Examiner—Tuan Nguyen
Attorney, Agent, or Firm—Joe E. Barbee; Miriam Jackson

[57] ABSTRACT

Metal step coverage is improved by utilizing a multiple step metallization process. In the first step, a thick portion of a metal layer is deposited on a semiconductor wafer at a cold temperature. The remaining amount of metal is deposited in a second step as the temperature is ramped up to allow for reflow of the metal layer through grain growth, recrystallization and bulk diffusion. The thick portion of the metal layer deposited at the cold temperature is of adequate thickness so that it remains continuous at the higher temperature and enhances via filling.

11 Claims, 1 Drawing Sheet

MULTIPLE STEP METALLIZATION PROCESS

BACKGROUND OF THE INVENTION

This invention relates, in general, to semiconductor devices, and more particularly, to a metallization process for semiconductor devices.

Metal layers must reliably cover via having very high aspect ratios (the ratio of the depth to the width) to permit the design of high density integrated circuits. Steps having very great depths are also a problem. Metal step coverage is not a great problem when trying to cover less aggressive geometries, vias having low aspect ratios or steps having small depths. Adequate step coverage can be obtained on less aggressive geometries when the metal layer is deposited at a "cold" temperature of approximately less than or equal to 200° C. However, as step heights, via depths and aspect ratios have increased on integrated circuits, metal which is deposited at a cold temperature does not produce good step coverage due in part to severe cusping at the corners of vias, which forms because the deposition is not conformal, and also due to physical shadowing from the via structure itself. The cusping causes the via to be closed before the metal has actually filled the via. One solution to this problem is to increase the temperature at which the metal layer is deposited to provide increased metal mobility to achieve acceptable step coverage. This high temperature is typically in the range of 400° C. to 500° C. However, as the temperature at which metal is deposited is increased, another problem has arisen. The use of higher deposition temperatures causes unpredictable voiding or discontinuities in the metal layer. Voiding occurs when there is insufficient metal in a certain area to support continuous grain growth. This problem is worsened when the aspect ratios of vias increase, because the amount of metal deposited in the bottom corners and on the sidewalls decreases due to shadowing and cusping at corners of the via. Although an increase in the deposition temperature was supposed to improve metal atom surface mobility to fill deeper vias, the increase in temperature frequently causes the early formation of widely spaced grains that lead to the formation of voids. Insufficient filling of a via caused by cusping or voiding of the metal layer is undesirable because it may cause devices to be inoperable, or at the minimum, to have reliability problems.

Adequate step coverage has been achieved by the use of flared or tiered vias. Flared or tiered vias reduce the cusping at the corners of a step or via, however valuable semiconductor area is consumed. Using low metal deposition rates also can help to achieve adequate step coverage, however, throughput is severely lowered, which makes the process too costly.

A multi-step deposition process has been used to improve step coverage in vias or steps having increased depths or aspect ratios. This process entails the deposition of a thin portion of the metal layer at a cold temperature. After the thin portion of the metal layer has been deposited, the temperature is ramped up to approximately 400° C. to 500° C., where the bulk of the metal layer is deposited. In this process it is thought to be desirable to deposit only a thin portion of the metal layer as early as possible so that the bulk of the metal layer can be deposited at the higher temperature under high mobility conditions in order to reduce voiding. The thin portion of the metal layer deposited at a cold temperature is needed to provide for surface diffusion. This process, however, has been found to still produce a large fraction of voiding by not supporting continuous grain growth.

Another attempt at providing adequate step coverage entails depositing all the metal layer, and then planarizing the metal layer by melting or reflowing the metal with a laser. This process, however, is not very reproducible with aluminum or aluminum alloys because a native oxide forms on the aluminum, thus preventing planarization. In addition, aluminum requires a high optical pulse energy due to its high reflectance, and variations in surface topography can increase absorbed power, thus causing damage.

The above described processes used conventional means of depositing metal films with the use of an evaporator or a sputterer. A metallization process using an unconventional deposition technique was disclosed in a paper by T. M. Lu, P. Bai and A. S. Yapsir, entitled "Partially Ionized Beam Processing: Via Filling and Planarization," published in Semiconductor Research Corporation TECHON '88, Oct. 12-14, 1988, Dallas, Tex., extended abstracts pp. 75-78. The authors found that applying a partially ionized beam (PIB) deposition technique produced metal layers having adequate step coverage and planarization. The PIB process utilized a two-step deposition with different substrate temperatures. Part of the metal layer is deposited at a temperature of 150° C., and after the via or trench is filled, the remaining metal layer is deposited at a temperature of 300° C. During the first step, the filling of the via is completely non-conformal; the via is filled without much cusping unlike with metal deposited by conventional means at a cold temperature. A higher temperature is used to achieve planarization of the metal layer. If no ions are applied during the deposition of metal at 300° C., a very rough film would form. This process does produce adequate results, however, is not very manufacturable because the deposition rate, 13 angstroms/sec, is very low, and a substrate bias of several kV is needed to achieve via filling and planarization. A low deposition rate is undesirable because of low throughput and risk of gaseous inclusion into the metal layer, which makes the metal more porous and less reliable. A very high substrate bias is also undesirable because the process is hard to maintain at a constant voltage and high voltages may damage semiconductor devices.

By now it should be appreciated that it would be advantageous to provide an improved metallization process using conventional deposition means to achieve adequate metal step coverage.

Accordingly, it is an object of the present invention to provide an improved method of depositing a metal layer which provides a high degree of step coverage over high steps and into vias having very high aspect ratios.

Another object of the present invention is to provide an improved method of depositing a metal layer without the formation of voids.

A further object of the present invention is to provide an improved method of providing adequate metal step coverage utilizing the metal's recrystallization, bulk diffusion and grain growth properties to reduce the formation of voids.

Yet another object of the present invention is to provide a metallization process that has high throughput.

SUMMARY OF THE INVENTION

In accordance with the present invention, the above and other objects and advantages are provided by a multiple step metallization process which allows a metal layer to reflow in situ. A first thick portion of a metal layer is formed on a semiconductor wafer at a cold temperature, such that the metal layer is of adequate thickness so that the metal layer remains continuous during the restructuring which will take place at higher temperatures. The remaining amount of the metal layer is deposited at the higher temperature which allows reflow of the metal layer through grain growth, recrystallization and bulk diffusion.

DETAILED DESCRIPTION OF DRAWINGS

Figure 1:
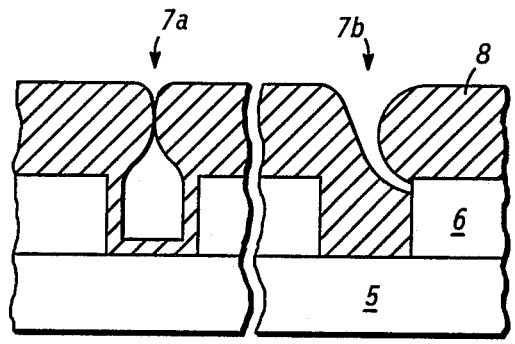
FIG. 1 illustrates an enlarged, cross-sectional view of a semiconductor wafer having insufficient via filling by using prior art methods.

FIG. 1 illustrates an enlarged, cross-sectional view of a portion of a semiconductor wafer 4 having insufficient step coverage by using prior art methods. Semiconductor wafer 4 is comprised of a layer 5, which can be a substrate or a metal layer. Layer 6 is a dielectric layer which has vias 7a and 7b formed therein. Metal layer 8 deposited on semiconductor wafer 4 in via 7a illustrates deposition of metal layer 8 deposited at a cold temperature. Severe cusping at the corners of via 7a prevents the complete filling of via 7a. Metal layer 8 deposited in via 7b illustrates voiding which takes place when metal layer 8 is deposited at a high temperature.

Figure 2:
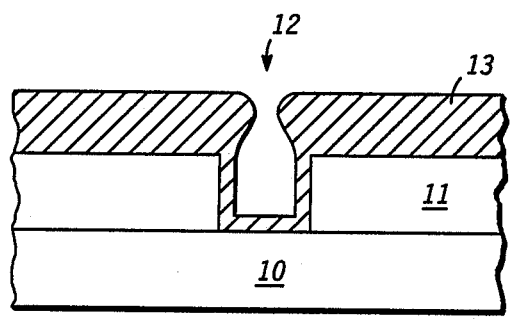
FIGS. 2-4 illustrate enlarged, cross-sectional views of a portion of a semiconductor wafer during various stages of an embodiment of the present invention.

FIG. 2 illustrates an enlarged, cross-sectional view of a portion of a semiconductor wafer 9 in a beginning stage of the present invention. Semiconductor wafer 9 is comprised of a layer 10, which can be a semiconductor substrate or a metal layer. On layer 10, a layer 11, typically an interlayer dielectric, such as silicon dioxide, silicon nitride, or the like is formed using standard processes well known in the art. Dielectric layer 11 is etched to form a via (or contact opening) 12 therein. The coverage of steps (not shown) is analogous to the coverage of vias, thus is not illustrated here. A multiple step deposition process is used to deposit metal layer 13. Deposition of metal layer 13 may be carried out in a sputter or an evaporator. In this embodiment, metal layer 13 is comprised of an aluminum alloy. FIG. 2 illustrates the first step in the deposition process. In this first step, a thick portion of metal layer 13 is deposited at a cold temperature of approximately less than or equal to 200° C. The thickness of metal layer 13 deposited at this step depends on the geometry to be covered, but is thick enough to provide stability without excessive cusping at the corners of via 12. This thickness is preferably approximately 50% to 75% of the total desired thickness of metal layer 13. For example, if the total desired thickness of metal layer 13 is 10,000 angstroms, then 5,000 to 7,500 angstroms of metal layer 13 is preferably deposited in the first step. Metal layer 13 is preferably deposited at a high rate of approximately greater than 150 angstroms/sec. A substrate bias of approximately 200 to 400 volts may also be used, but is not necessary.

Figure 3:
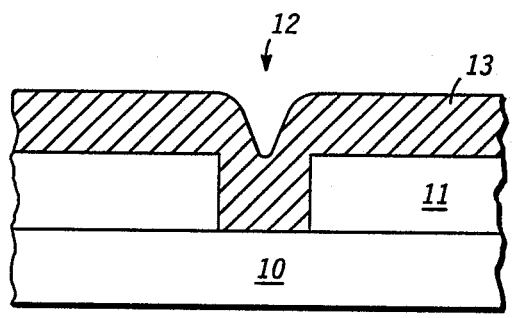

FIG. 3 illustrates the structure of FIG. 2 with more metal 13 deposited in a second step. In the second step, while metal 13 is still being deposited, the temperature is increased enough to begin the reflow of metal layer 13. In this described embodiment, an aluminum alloy is used, so a temperature of approximately 400° C. to 500° C. is preferably used. Reflow of metal layer 13 takes place through bulk diffusion and recrystallization. At the high temperature metal layer 13 will reflow into via 12. In the present invention, reflow of metal layer 13 takes place in situ, thus surface oxidation of metal layer 13 does not take place. If not enough metal layer 13 is deposited in the first step, as in the method discussed in the Background above, voids may still be formed because there is not enough metal layer 13 for a continuous layer to remain, even though bulk diffusion and recrystallization takes place. When a thick portion of metal layer 13 is deposited at the cold temperature, a continuous metal film remains in via 12 because of bulk diffusion from nearby grains. The second deposition step may be done at a slower deposition rate in order to insure that maximum reflow of metal layer 13 takes place. The deposition rate, however, should still preferably be at a high rate of 50 angstroms/sec. A more preferable high deposition rate is in the range of 100 to 200 angstroms/sec.

Figure 4:
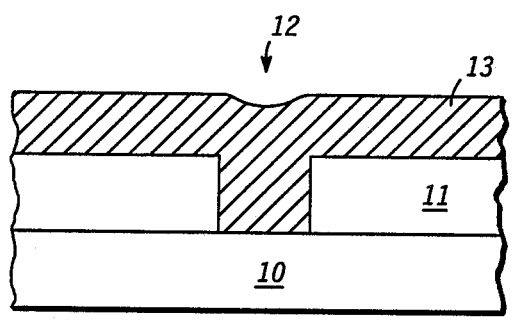

If metal 13 deposited in the second step is deposited at a slower deposition rate, it may be desirable to finish the deposition of metal layer 13 in a third deposition step using a higher deposition rate to bring metal layer 13 to the specified film thickness. This is illustrated in FIG. 4. Depositing metal layer 13 at a higher deposition rate increases throughput. At this point in the process, the temperature should be at the peak temperature.

Thus, if metal layer 13 deposited in the first step is of adequate thickness, metal layer 13 will remain continuous as the temperature is increased and further metal is deposited to reach a desired thickness. Step coverage of via 12 is maximized by utilizing the recrystallization, bulk diffusion and grain growth properties of metal layer 13 in such a way that the free energy reduction favors a filled via rather than the formation of a void.

By now it should be appreciated that there has been provided a new and improved method of depositing metal in a multiple step deposition process in order to obtain step coverage of vias having high aspect ratios. The process of the present invention allows for the reflow and redistribution of metal in situ.

We claim:

1. An in situ metallization process, comprising the steps of:
    providing a semiconductor wafer having a via formed therein;
    forming a thick portion of a predetermined thickness of a metal layer on the semiconductor wafer at a cold temperature, and wherein the portion of the metal layer is of sufficient thickness to remain continuous in the via at a high temperature; and
    forming the remaining portion of the predetermined thickness of the metal layer on the semiconductor wafer while increasing the temperature to the high temperature which allows for reflow of the metal layer.

2. The process of claim 1, wherein the thick portion of metal layer deposited at the cold temperature is approximately 50% to 75% of the predetermined thickness of the metal layer.

3. The process of claim 1, wherein the cold temperature is approximately less than 200° C. and the high temperature is approximately 400° C. to 500° C.

4. The process of claim 1 wherein the remaining portion of the predetermined thickness of the metal layer is formed at a slow rate, then by a fast rate to achieve the predetermined thickness of the metal layer.

5. An in situ metallization process, comprising the steps of:
   providing a semiconductor wafer having a via formed therein;
   depositing, by conventional means, a first thick portion of a predetermined thickness of a metal layer on the semiconductor wafer at a cold temperature of approximately less than 200° C., wherein the first thick portion is of a sufficient thickness to form a continuous metal layer in the via at a high temperature of approximately 400° C. to 500° C.; and
   increasing the temperature to the high temperature which allows for reflow of the metal layer, and depositing a second portion of the metal layer on the semiconductor wafer to achieve the predetermined thickness.

6. The process of claim 5 wherein the first thick portion of the metal layer is approximately 50% to 75% of the predetermined thickness of the metal layer.

7. The process of claim 5 wherein depositing the first and second portions of the metal layer is done at a high rate.

8. The process of claim 5 wherein the metal layer is an aluminum alloy.

9. An in situ metallization process, comprising the steps of:
   providing a semiconductor wafer having a via formed therein;
   depositing a first thick portion of a metal layer on the semiconductor wafer at a cold temperature, wherein the first thick portion is of sufficient thickness for a continuous metal layer to remain in the via at a high temperature;
   depositing a second portion of the metal layer while the temperature is being increased to the high temperature which allows for reflow of the metal layer, and wherein the second portion is deposited at a slower rate than the first portion; and
   depositing a third portion of the metal layer at a faster rate than the second portion to complete the formation of a final predetermined thickness of the metal layer.

10. The process of claim 9 wherein the first portion of the metal layer is of a thickness of approximately 50 to 75% of the final predetermined thickness of the metal layer.

11. The process of claim 9, wherein the cold temperature is approximately less than 200° C. and the high temperature is approximately 400° C. to 500° C.

* * * * *